United States Patent
Lee et al.

(10) Patent No.: US 7,723,736 B2
(45) Date of Patent: May 25, 2010

(54) LIGHT EMITTING DEVICE HAVING A PLURALITY OF LIGHT EMITTING CELLS AND PACKAGE MOUNTING THE SAME

(75) Inventors: Chung Hoon Lee, Gwangmyeong-si (KR); Lacroix Yves, Ansan-si (KR); Hyung Soo Yoon, Ansan-si (KR); Young Ju Lee, Ansan-si (KR)

(73) Assignee: Seoul Opto Device Co., Ltd., Ansan-si (KR)

( * ) Notice: Subject to any disclaimer, the term of this patent is extended or adjusted under 35 U.S.C. 154(b) by 159 days.

(21) Appl. No.: 11/721,803

(22) PCT Filed: Oct. 25, 2005

(86) PCT No.: PCT/KR2005/003555

§ 371 (c)(1),
(2), (4) Date: Jun. 14, 2007

(87) PCT Pub. No.: WO2006/098545

PCT Pub. Date: Sep. 21, 2006

(65) Prior Publication Data

US 2008/0087902 A1   Apr. 17, 2008

(30) Foreign Application Priority Data

Dec. 14, 2004 (KR) ............... 10-2004-0105368
Jan. 29, 2005 (KR) ............... 10-2005-0008309

(51) Int. Cl.
*H01L 29/18* (2006.01)
*H01L 23/48* (2006.01)
*H01L 33/00* (2010.01)

(52) U.S. Cl. .................. 257/88; 257/98; 257/99; 257/103; 257/778; 257/E33.056; 257/E33.057; 257/E33.065; 257/E33.066; 438/22

(58) Field of Classification Search .................. 257/88, 257/14, 98, 99, 103, 676, E33.055–E33.059, 257/E33.062–E33.066, 623; 438/22
See application file for complete search history.

(56) References Cited

U.S. PATENT DOCUMENTS 6,547,249 B2   4/2003   Collins, III et al.

(Continued)

FOREIGN PATENT DOCUMENTS

DE        10213464 A1    10/2002

(Continued)

OTHER PUBLICATIONS

DE Office Action dated Feb. 4, 2009.

*Primary Examiner*—Zandra Smith
*Assistant Examiner*—Jeremy J Joy
(74) *Attorney, Agent, or Firm*—H.C. Park & Associates, PLC

(57) ABSTRACT

Disclosed is a light emitting device having a plurality of light emitting cells and a package having the same mounted thereon. The light emitting device includes a plurality of light emitting cells which are formed on a substrate and each of which has an N-type semiconductor layer and a P-type semiconductor layer located on a portion of the N-type semiconductor layer. The plurality of light emitting cells are bonded to a submount substrate. Accordingly, heat generated from the light emitting cells can be easily dissipated, so that a thermal load on the light emitting device can be reduced. Meanwhile, since the plurality of light emitting cells are electrically connected using connection electrodes or electrode layers formed on the submount substrate, it is possible to provide light emitting cell arrays connected to each other in series. Further, it is possible to provide a light emitting device capable of being directly driven by an AC power source by connecting the serially connected light emitting cell arrays in reverse parallel to each other.

16 Claims, 4 Drawing Sheets

U.S. PATENT DOCUMENTS

| | | | |
|---|---|---|---|
| 2002/0197764 A1* | 12/2002 | Uemura et al. | 438/79 |
| 2003/0205712 A1* | 11/2003 | Bhat et al. | 257/79 |
| 2004/0012958 A1 | 1/2004 | Hashimoto et al. | |
| 2004/0026708 A1 | 2/2004 | Chen | |
| 2004/0075399 A1* | 4/2004 | Hall | 315/291 |
| 2004/0211972 A1* | 10/2004 | Du et al. | 257/99 |
| 2004/0217362 A1* | 11/2004 | Slater et al. | 257/79 |
| 2005/0077532 A1* | 4/2005 | Ota et al. | 257/98 |
| 2005/0205890 A1* | 9/2005 | Uemura | 257/103 |
| 2005/0211989 A1* | 9/2005 | Horio et al. | 257/79 |
| 2005/0225973 A1* | 10/2005 | Eliashevich et al. | 362/217 |
| 2006/0202225 A1* | 9/2006 | Kim et al. | 257/99 |
| 2009/0272971 A1* | 11/2009 | Lee et al. | 257/43 |

FOREIGN PATENT DOCUMENTS

| | | | |
|---|---|---|---|
| DE | 102006049081 | | 4/2008 |
| EP | 1267424 | | 12/2002 |
| JP | 05-198843 | | 8/1993 |
| JP | 2000-049374 | | 2/2000 |
| JP | 2001-217467 | | 8/2001 |
| JP | 2001217467 A | * | 8/2001 |
| JP | 2002-118293 | | 4/2002 |
| JP | 2002118293 A | * | 4/2002 |
| JP | 2003-008083 | | 1/2003 |
| JP | 2003-092011 | | 3/2003 |
| JP | 2004-006582 | | 1/2004 |
| JP | 2004-241729 | | 8/2004 |

\* cited by examiner

[Fig. 1]
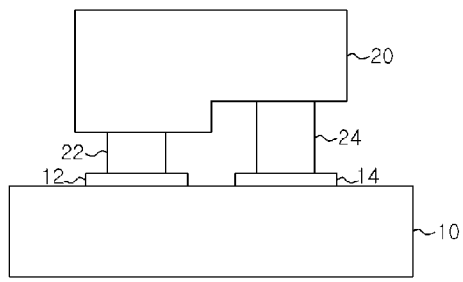
[Fig. 2]
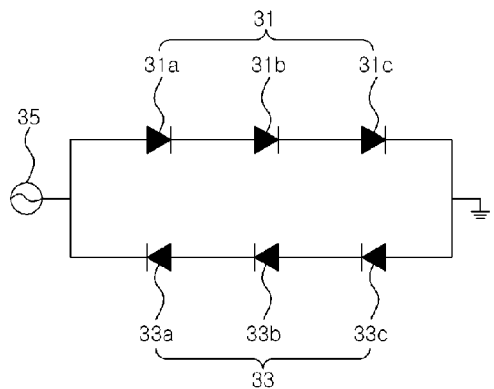
[Fig. 3]
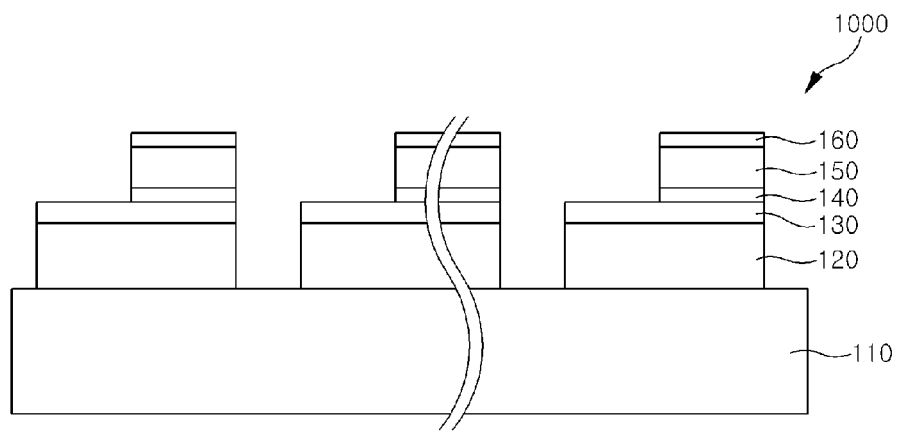
[Fig. 4]
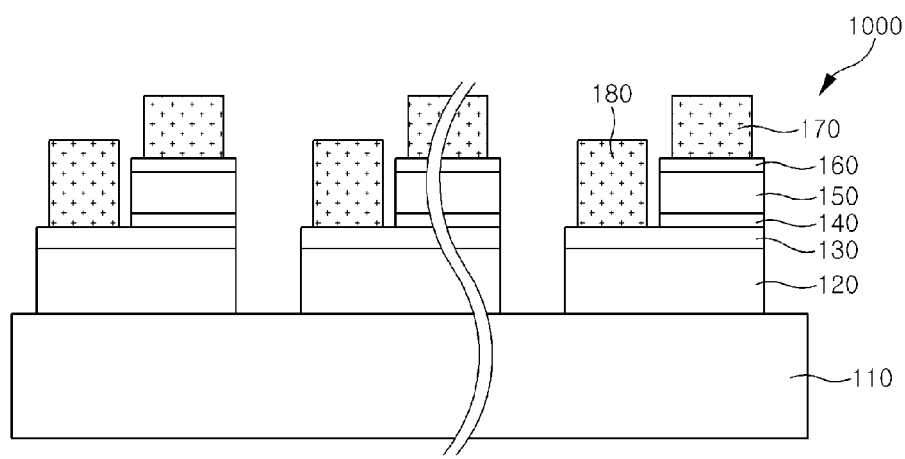

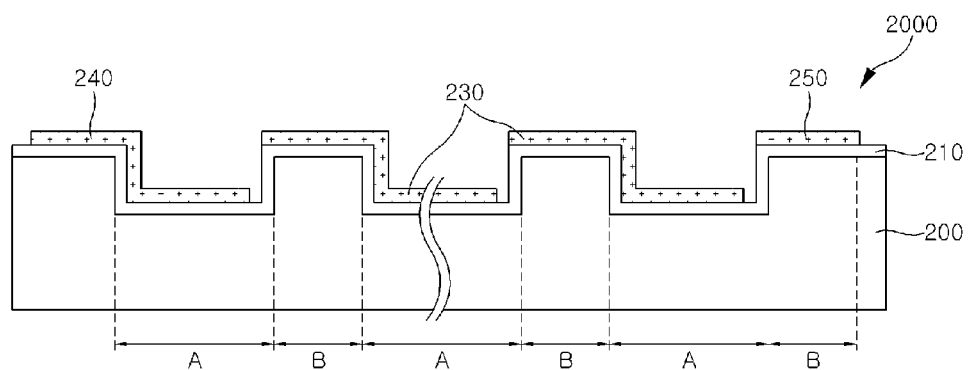
[Fig. 5]
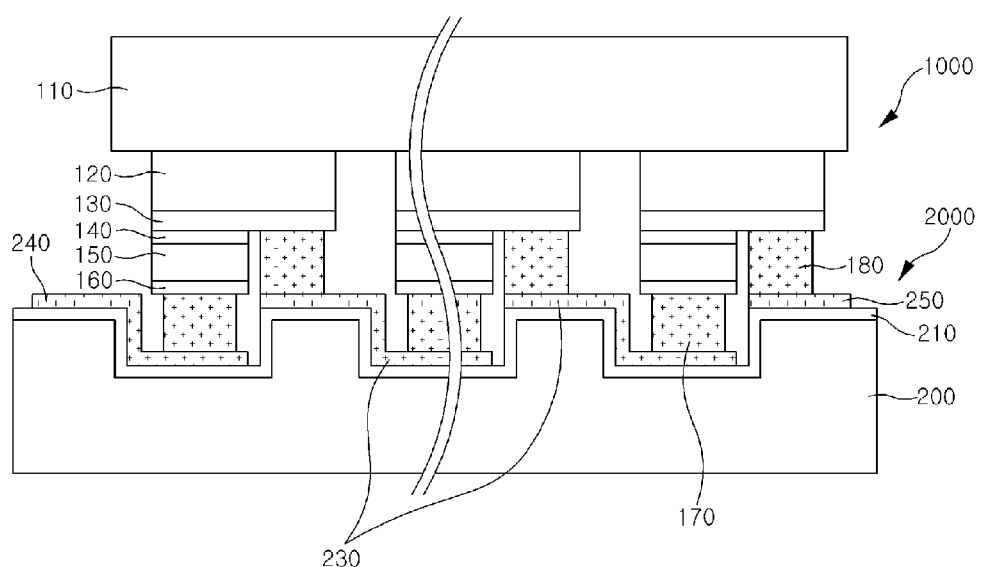
[Fig. 6]
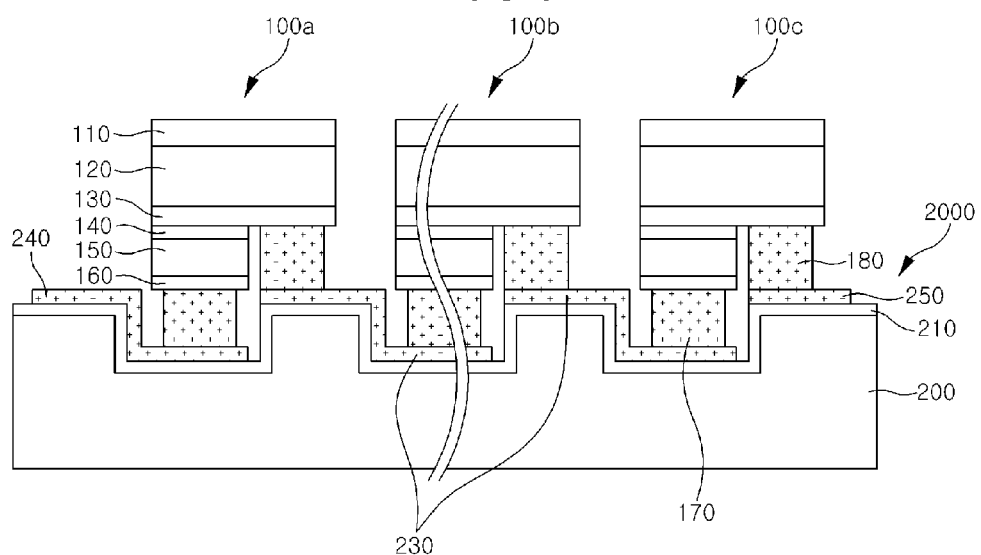
[Fig. 7]

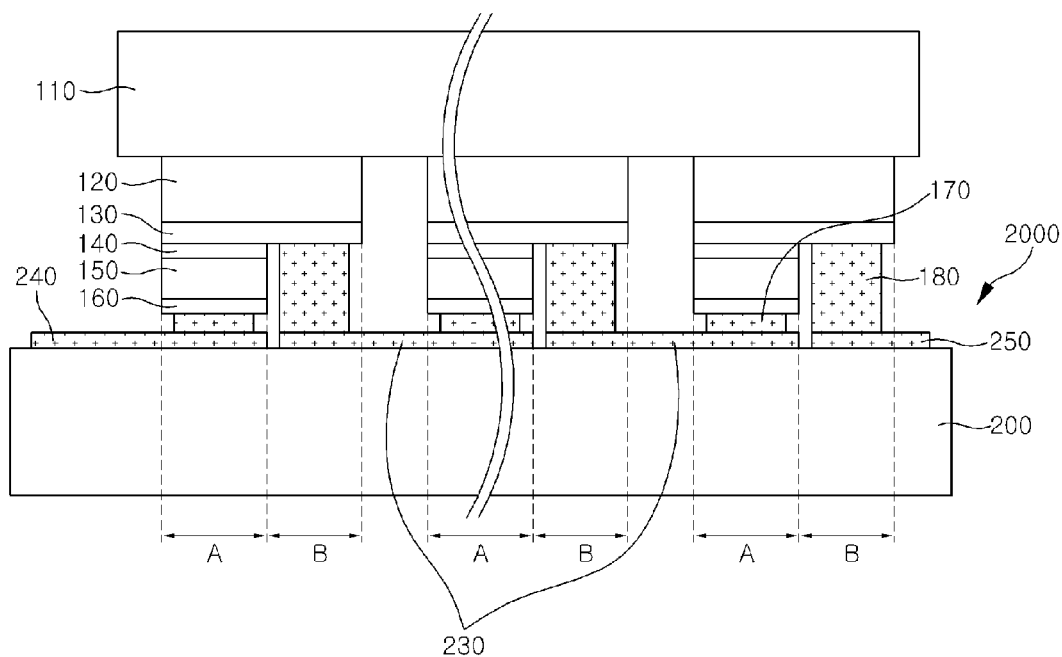
[Fig. 8]
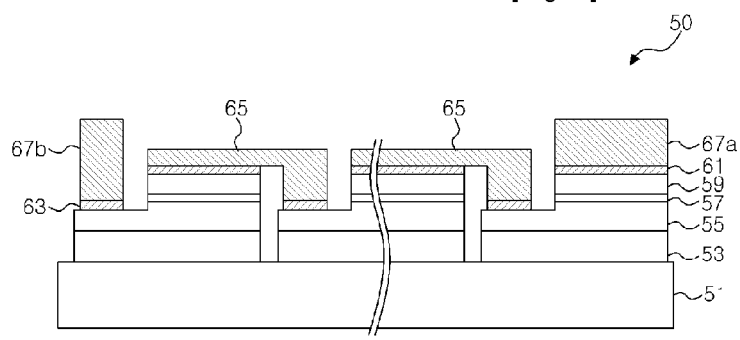
[Fig. 9]
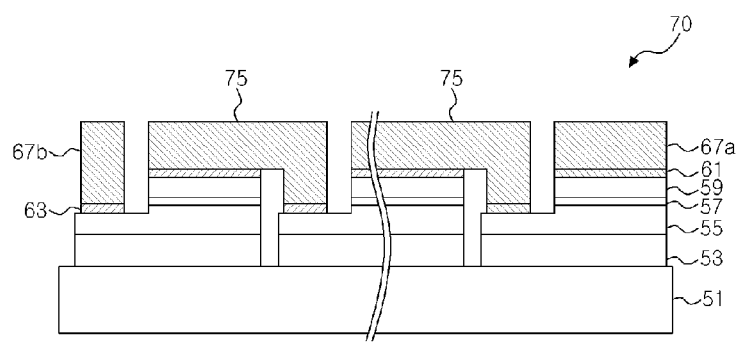
[Fig. 10]

[Fig. 11]
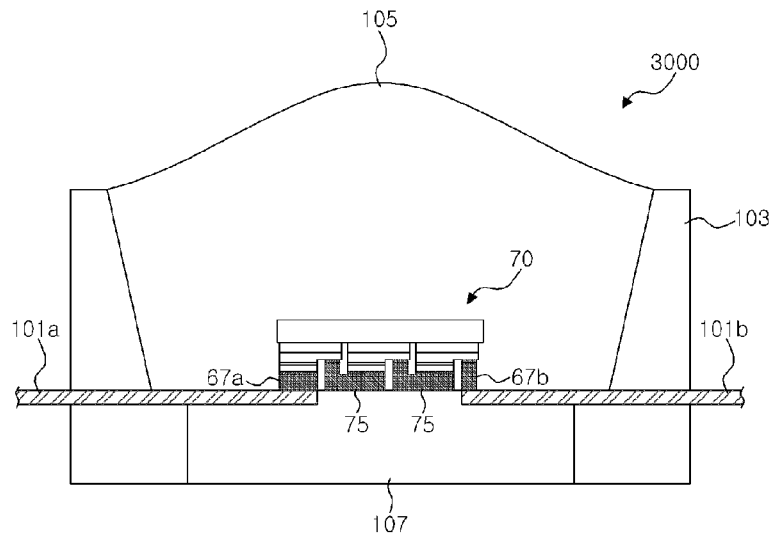
[Fig. 12]
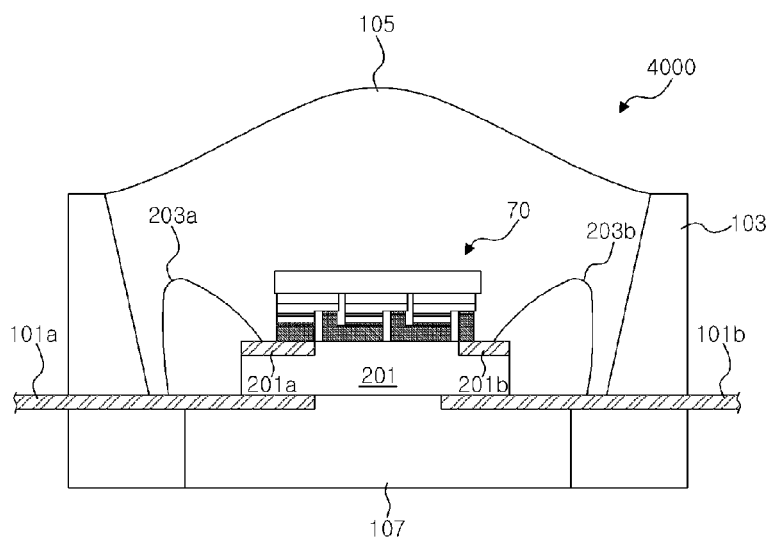
[Fig. 13]
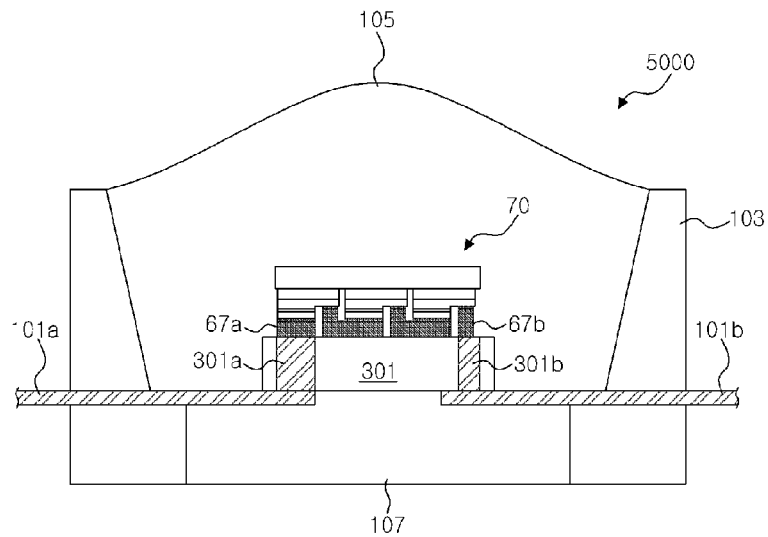

LIGHT EMITTING DEVICE HAVING A PLURALITY OF LIGHT EMITTING CELLS AND PACKAGE MOUNTING THE SAME

TECHNICAL FIELD

The present invention relates to a light emitting device having a plurality of light emitting cells and a package having the same mounted thereon, and more particularly, to a light emitting device having a plurality of light emitting cells, which form serial arrays on a single substrate and can be directly driven using an AC power source, and a package having the same mounted thereon.

BACKGROUND ART

A light emitting diode is an electroluminescence device having a structure in which an n-type semiconductor of which major carriers are electrons and a p-type semi-conductor of which major carriers are holes are joined together, and emits predetermined light through recombination of these electrons and holes. Such light emitting diodes are used as display devices and backlights, and their application area has expanded to the use thereof for general illumination while substituting the conventional incandescent bulbs and fluorescent lamps.

A light emitting diode consumes less electric power and has a longer service life as compared with conventional light bulbs or fluorescent lamps. The electric power consumption of a light emitting diode is less than a few tenth to a few hundredth of those of conventional illumination devices, and the life span thereof is several to several ten times, thereby having reduced electric power consumption and excellent durability.

To use such light emitting diodes for illumination, it is necessary to effectively dissipate heat produced from light emitting devices to the outside. Accordingly, interest in flip-chip type light emitting devices capable of effectively dissipating heat produced from the light emitting devices to the outside is increasing.

FIG. 1 is a sectional view illustrating a conventional flip-chip type light emitting device 20.

Referring to FIG. 1, first and second electrodes 12 and 14 are formed on a predetermined substrate 10, e.g., a submount substrate or a lead frame, and solders 22 and 24 are formed on these electrodes. Then, a light emitting device 20 is bonded on the substrate 10. At this time, a P-type semiconductor layer and an N-type semiconductor layer of the light emitting device 20 are bonded to the respective solders. Thereafter, the substrate 10 with the light emitting device 20 bonded thereon is encapsulated.

Such conventional flip-chip type light emitting devices have higher heat dissipation efficiency as compared with other light emitting devices using bonding wires, and have improved optical efficiency because little light is shielded. Further, the flip-chip type light emitting devices have an advantage in that their packages can be compacted because they do not use bonding wires.

However, since such a light emitting device is repeatedly turned on and off depending on the phase of an AC power source, there is a problem in that the light emitting device may be easily damaged. Accordingly, it is difficult to use a light emitting device for the purpose of general illumination by connecting it directly to a household AC power source.

DISCLOSURE OF INVENTION

Technical Problem

An object of the present invention is to provide a light emitting device that can be driven by being connected directly to a AC power source.

Another object of the present invention is to provide a light emitting device, wherein a thermal load on the light emitting device can be reduced and light emission efficiency can be improved.

A further object of the present invention is to provide a package that mounts the light emitting device thereon and can be driven by being connected directly to an AC power source.

A still further object of the present invention is to provide a light emitting device, wherein the complication of a process of mounting the light emitting device on a submount or a lead frame can be prevented.

Technical Solution

To achieve these objects of the present invention, the present invention provides a light emitting device having a plurality of light emitting cells and a package having the same mounted thereon. A light emitting device according to an aspect of the present invention comprises a plurality of light emitting cells which are formed on a substrate and each of which has an N-type semiconductor layer and a P-type semiconductor layer located on a portion of the N-type semiconductor layer. The plurality of light emitting cells are bonded to a submount substrate. Accordingly, since heat generated from the light emitting cells can be easily dissipated, a thermal load on the light emitting device can be reduced.

In some embodiments of the present invention, the submount substrate may include a plurality of electrode layers spaced apart from one another. The plurality of light emitting cells may be bonded to the electrode layers. At this time, the electrode layers may electrically connect N-type semiconductor layers and P-type semiconductor layers of two adjacent light emitting cells among the plurality of light emitting cells. Accordingly, the electrode layers may serially connect the plurality of light emitting cells to a serial light emitting cell array. At least two serial light emitting cell arrays may be formed and they may be connected in reverse parallel to each other, thereby providing a light emitting device capable of being directly driven by an AC power source.

A conventional flip-chip light emitting device 20 means a light emitting chip with one light emitting diode formed therein. However, a light emitting device of the present invention has a plurality of light emitting diodes on a single substrate. Thus, the term "light emitting cell" means each of the plurality of light emitting diodes formed on the single substrate. Further, the term "serial light emitting cell array" means a structure in which a plurality of light emitting cells are connected in series. Two serial light emitting cell arrays on the single substrate can be connected to be driven by respective currents flowing in opposite directions. Accordingly, the light emitting device can be connected directly to an AC power source without the use of an AC-to-DC converter or the like, so that the light emitting device can be used for general illumination.

In the meantime, the light emitting device may further include an N-type metal bumper formed on each of the N-type semiconductor layers and a P-type metal bumper formed on each of the P-type semiconductor layers. The plurality of light emitting cells are bonded to the electrode layers through the N-type and P-type metal bumpers. Accordingly, the plurality of light emitting cells are electrically connected to the electrode layers through the metal bumpers, and at the same time, heat can be easily dissipated to the submount substrate through the metal bumpers.

The submount substrate may have a plurality of concave portions and convex portions, and the N-type semiconductor layers and the P-type semiconductor layers may be bonded to the convex portions and the concave portions, respectively. The concave portions and the convex portions can be defined as N-regions and P-regions, respectively. At this time, each of the electrode layers is formed over the P-region and the N-region to connect the P-region and the N-region.

In the embodiments of the present invention, the submount substrate may include a P-type bonding pad formed at an edge thereof and an N-type bonding pad formed at the other edge thereof.

In the meantime, among the plurality of light emitting cells, a P-type semiconductor layer of a light emitting cell located at the edge of the substrate may be electrically connected to the P-type bonding pad, and an N-type semiconductor layer of a light emitting cell located at the other edge of the substrate may be electrically connected to the N-type bonding pad.

The P-type semiconductor layer and the P-type bonding pad may be electrically connected to each other through a P-type metal bumper, and the N-type semiconductor layer and the N-type bonding pad may be electrically connected to each other through an N-type metal bumper.

a plurality of connection electrodes may connect the N-type semiconductor layers and the P-type semiconductor layers of adjacent light emitting cells between the light emitting cell located at the edge of the substrate and the light emitting cell located at the other edge of the substrate, thereby forming a serial light emitting cell array on the substrate. Meanwhile, each of the plural light emitting cells may include a buffer layer formed on the substrate. The N-type semiconductor layer may be formed on the buffer layer, and an active layer may be located on a portion of the N-type semiconductor layer. Further, the P-type semiconductor layer may be located on the active layer. In addition, a first metal layer may be formed on the P-type semiconductor layer, and a second metal layer may be formed on the first metal layer. The first metal layer may be a transparent electrode, and the second metal layer may be a reflective film.

A light emitting device according to another aspect of the present invention comprises a plurality of light emitting cells formed on a substrate. Each of the plural light emitting cells has an N-type semiconductor layer and a P-type semiconductor layer located on a portion of the N-type semiconductor layer. Meanwhile, an N-type metal bumper is formed on an N-type semiconductor layer of one light emitting cell among the plurality of light emitting cells, and a P-type metal bumper is formed on a P-type semiconductor layer of another light emitting cell among the plurality of light emitting cells. The light emitting device is mounted on a lead frame or a submount substrate through the N-type metal bumper and the P-type metal bumper.

In some embodiments of the present invention, in addition to the N-type metal bumper, other N-type metal bumpers may be formed on N-type semiconductor layers of light emitting cells except the above one light emitting cell among the plurality of light emitting cells, and in addition to the P-type metal bumper, other P-type metal bumpers may be formed on P-type semiconductor layers of light emitting cells except the above another light emitting cell among the plurality of light emitting cells. A serial light emitting cell array may be formed by forming electrode layers on the submount substrate and electrically connecting the N-type and P-type metal bumpers through the electrode layers.

On the contrary, a serial light emitting cell array may be formed on the substrate by electrically connecting the N-type semiconductor layers and the P-type semiconductor layers of the adjacent light emitting cells with a plurality of connection electrodes. At this time, the above one light emitting cell and the above another light emitting cell may be located at both ends of the serial light emitting cell array. In addition, a top surface of the N-type metal bumper formed on the N-type semiconductor layer of the one light emitting cell and a top surface of the P-type metal bumper formed on the P-type semiconductor layer of the other light emitting cell may be at least flush with top surfaces of the connection electrodes. That is, the top surfaces of the connection electrodes may be located below or at the same level as the top surfaces of the N-type and P-type metal bumpers. If the top surfaces of the connection electrodes are located below the top surfaces of the metal bumpers, a short circuit between the connection electrodes and the submount substrate or lead frame can be prevented. If the top surfaces of the connection electrodes are located at the same level as the top surfaces of the bonding pads, the top surfaces of the connection electrodes may be in direct contact with the submount substrate or lead frame, thereby promoting dissipation of heat.

A further aspect of the present invention provides a submount substrate for mounting a plurality of light emitting cells thereon. The submount substrate includes a substrate having a plurality of N-regions and P-regions defined thereon. A plurality of electrode layers are located on the substrate while being spaced apart from one another. The electrode layers connect adjacent N-regions and P-regions. At this time, a dielectric film may be located beneath the plurality of electrodes layers.

In the meantime, the substrate may have concave portions and convex portions, and the convex portions and the concave portions may be defined as the N-regions and the P-regions, respectively.

A still further aspect of the present invention provides a package on which a light emitting device having a plurality of light emitting cells is mounted. The package comprises a lead frame having metal leads. A light emitting device is located on the lead frame. The light emitting device includes a plurality of light emitting cells formed on a substrate. Each of the plurality of light emitting cells has an N-type semiconductor layer, and a P-type semiconductor layer located on a portion of the N-type semiconductor layer. A plurality of connection electrodes may electrically connect N-type semiconductor layers and P-type semiconductor layers of adjacent light emitting cells, thereby forming a serial light emitting cell array on the substrate. In addition, metal bumpers may be located at both ends of the serial light emitting cell array. The metal bumpers may be electrically connected to the metal leads. Accordingly, even though there are the plurality of light emitting cells, bonding can be simplified since the metal bumpers located at the both ends of the serial light emitting cell array are connected to the metal leads. The complication of the process of mounting the light emitting device can be prevented, as compared with a conventional process of mounting a flip-chip type light emitting device.

In addition, a submount substrate may be interposed between the lead frame and the light emitting device. The submount substrate may have bonding pads corresponding to the metal bumpers on a top surface thereof. The bonding pads may be electrically connected to the metal leads.

The bonding pads may be electrically connected to the metal leads through bonding wires or directly to the metal leads through a circuit formed on the submount substrate.

Meanwhile, the connection electrodes of the light emitting device may come into contact with the top surface of the submount substrate. At this time, heat generated from the light emitting device can be dissipated through the submount substrate, thereby promoting the dissipation of heat. On the contrary, the connection electrodes may be spaced apart from the top surface of the submount substrate. Accordingly, a short circuit between the connection electrodes and the metal leads can be easily prevented.

Advantageous Effects

According to the present invention, there is provided a light emitting diode that can be driven through direct connection to an AC power source by employing serial light emitting cell arrays having a plurality of light emitting cells connected in series. Since a flip-chip type light emitting device having a plurality of light emitting cells connected in series is implemented, heat generated from the light emitting cells can be easily dissipated, thereby reducing a thermal load on the light emitting device and improving light emitting efficiency as well. Meanwhile, it is possible to provide a package that can be driven through direct connection to an AC power source by mounting the light emitting device thereon. Moreover, even though the plurality of light emitting cells are employed, the process of mounting the plurality of light emitting cells on a submount substrate or lead frame can be simplified since the plurality of light emitting cells are connected in series using connection electrodes.

BRIEF DESCRIPTION OF THE DRAWINGS

FIG. 1 is a sectional view illustrating a conventional flip-chip type light emitting device.

FIG. 2 is a circuit diagram illustrating an operational principle of a light emitting device having a plurality of light emitting cells according to an embodiment of the present invention.

FIGS. 3 and 4 are sectional views illustrating a light emitting cell block of a flip-chip type light emitting device according to an embodiment of the present invention.

FIG. 5 is a sectional view illustrating a flip-chip type submount substrate according to an embodiment of the present invention.

FIG. 6 is a sectional view illustrating a light emitting device having the light emitting cell block of FIG. 4 mounted on the submount substrate of FIG. 5 according to an embodiment of the present invention.

FIG. 7 is a sectional view illustrating a light emitting device having a plurality of light emitting cells mounted on a submount substrate according to another embodiment of the present invention.

FIG. 8 is a sectional view illustrating a light emitting device having a light emitting cell block mounted on a submount substrate according to a further embodiment of the present invention.

FIGS. 9 and 10 are sectional views illustrating light emitting devices according to still further embodiments of the present invention.

FIGS. 11 to 13 are sectional views illustrating packages having the light emitting device of FIG. 10 mounted thereon.

BEST MODE FOR CARRYING OUT THE INVENTION

Hereinafter, embodiments of the present invention will be described in detail with reference to the accompanying drawings. The following embodiments are provided only for illustrative purposes so that those skilled in the art can fully understand the spirit of the present invention. Therefore, the present invention is not limited to the following embodiments but may be implemented in other forms. In the drawings, the widths, lengths, thicknesses and the like of elements can be exaggerated for convenience of illustration. Like reference numerals indicate like elements throughout the specification and drawings.

FIG. 2 is a circuit diagram illustrating an operational principle of a light emitting device having a plurality of light emitting cells according to an embodiment of the present invention.

Referring to FIG. 2, a first serial array 31 is formed by connecting light emitting cells 31a, 31b and 31c in series, and a second serial array 33 is formed by connecting other light emitting cells 33a, 33b and 33c in series.

Both ends of each of the first and second serial arrays 31 and 33 are connected to an AC power source 35 and a ground, respectively. The first and second serial arrays are connected in parallel between the AC power source 35 and the ground. That is, both ends of the first serial array are electrically connected to those of the second serial array.

Meanwhile, the first and second serial arrays 31 and 33 are arranged such that their light emitting cells are driven by currents flowing in opposite directions. In other words, as shown in the figure, anodes and cathodes of the light emitting cells included in the first serial array 31 and anodes and cathodes of the light emitting cells included in the second array 33 are arranged in opposite directions.

Thus, if the AC power source 35 is in a positive phase, the light emitting cells included in the first serial array 31 are turned on to emit light, and the light emitting cells included in the second serial array 33 are turned off. On the contrary, if the AC power source 35 is in a negative phase, the light emitting cells included in the first serial array 31 are turned off, and the light emitting cells included in the second serial array 33 are turned on.

Consequently, the first and second serial arrays 31 and 33 are alternately turned on and off by the AC power source so that the light emitting device including the first and second serial arrays continues to emit light.

Although light emitting chips, each of which comprises a single light emitting diode, can be connected to one another to be driven by an AC power source as in the circuit of FIG. 2, the space occupied by the light emitting chips may be increased. However, in the light emitting device of the present invention, a single chip can be driven by being connected to an AC power source, thereby preventing an increase in space occupied by the light emitting device.

Meanwhile, although the circuit shown in FIG. 2 is configured such that the both ends of each of the first and second serial arrays are connected to the AC power source 35 and the ground, respectively, the circuit may be configured such that the both ends thereof are connected to both terminals of the AC power source. Further, although each of the first and second serial arrays comprises three light emitting cells, this is only an illustrative example for better understanding and the number of light emitting cells may be increased, if necessary. The number of serial arrays may also be increased.

In the meantime, a bridge rectifier may be arranged between an AC power source and a serial array to provide a light emitting device driven by the AC power source. At this time, the bridge rectifier may be configured using the light emitting cells. By adopting such a bridge rectifier, it is possible to provide a light emitting device with only one serial array, which can be driven by the AC power source.

FIGS. 3 and 4 are sectional views illustrating a light emitting cell block 1000 of a flip-chip type light emitting device according to an embodiment of the present invention, and FIG. 5 is a sectional view illustrating a flip-chip type sub-mount substrate 2000 according to an embodiment of the present invention.

Referring to FIGS. 3 and 4, the light emitting cell block 1000 has a plurality of light emitting cells arrayed on a sapphire substrate 110. Each of the light emitting cells includes a buffer layer 120 formed on the substrate 110, an N-type semiconductor layer 130 formed on the buffer layer 120, an active layer 140 formed on a portion of the N-type semiconductor layer 130, and a P-type semiconductor layer 150 formed on the active layer 140. Further, a first metal layer 160 is formed on the P-type semiconductor layer 150. Meanwhile, a P-type metal bumper 170 is formed on the first metal layer 160 and an N-type metal bumper 180 is formed on the N-type semiconductor layer 130. Also, a second metal layer (not shown) having a reflectivity of 10 to 100% may be formed on the first metal layer 160 and the N-type semiconductor layer 130. Moreover, an additional ohmic metal layer for smooth supply of a current may be formed on the P-type semiconductor layer 150.

The substrate 110 may be a substrate made of $Al_2O_3$, SiC, ZnO, Si, GaAs, GaP, $LiAl_2O_3$, BN, AlN or GaN. The substrate 110 is selected in consideration of a lattice coefficient of a semiconductor layer formed thereon. For example, in a case where a GaN based semiconductor layer is formed on the substrate 110, a sapphire substrate 110 or a SiC substrate can be selected as the substrate 110. In this embodiment, the buffer layer 120 performing a buffering function is formed when the N-type semiconductor layer 130 is formed on the substrate 110. However, it is not limited thereto, and the buffer layer 120 may not be formed.

Although a gallium nitride (GaN) film doped with N-type impurities can be used as the N-type semiconductor layer 130, it is not limited thereto, and various semiconductor material layers may be used. In this embodiment, the N-type semiconductor layer 130 is formed to include an N-type $Al_xGa_{1-x}N$ ($0 \leq x \leq 1$) film. Further, a gallium nitride film doped with P-type impurities can used as the P-type semiconductor layer 150. In this embodiment, the P-type semiconductor layer 150 is formed to include a P-type $Al_xGa_{1-x}N$ ($0 \leq x \leq 1$) film. Meanwhile, an InGaN film may be used as the semiconductor layer. Moreover, each of the N-type semiconductor layer 130 and the P-type semiconductor layer 150 may be formed as a multi-layered film. Si is used as the N-type impurities, and Zn and Mg are used as the P-type impurities for InGaAlP and a nitride based compound, respectively.

Further, a multi-layered film having quantum well layers and barrier layers repeatedly formed on an N-type $Al_xGa_{1-x}N$ ($0 \leq x \leq 1$) film is used as the active layer 140. The barrier well layer and quantum well layer may be made of a binary compound such as GaN, InN or AlN, a tertiary compound such as $In_xGa_{1-x}N$ ($0 \leq x \leq 1$) or $Al_xGa_{1-x}N$ ($0 \leq x \leq 1$), or a quaternary compound such as $Al_xIn_xGa_{1-x-y}N$ ($0 \leq x+y \leq 1$). The binary to quaternary compounds may be doped with N-type or P-type impurities.

It is preferred that a transparent electrode film be used as the first metal layer 160. In this embodiment, ITO is used. A reflective film with electric conductivity is used as the second metal layer. The N-type and P-type metal bumpers 170 and 180 may be made of at least one of Pb, Sn, Au, Ge, Cu, Bi, Cd, Zn, Ag, Ni and Ti.

A method of fabricating the light emitting cell block 1000 with the aforementioned structure will be briefly described below.

The buffer layer 120, the N-type semiconductor layer 130, the active layer 140 and the P-type semiconductor layer 150 are sequentially formed on the substrate 110.

These material layers are formed through various deposition and growth methods including metal organic chemical vapor deposition (MOCVD), molecular beam epitaxy (MBE), hydride vapor phase epitaxy (HVPE), and the like.

The P-type semiconductor 150, the active layer 140, the N-type semiconductor layer 130 and the buffer layer 120 are partially removed to separate the light emitting cells. To this end, a predetermined mask pattern (not shown) is formed on the P-type semiconductor layer 150, and portions of the P-type semiconductor 150, the active layer 140, the N-type semiconductor layer 130 and the buffer layer 120, which are exposed through the mask pattern, are etched so that the plurality of light emitting cells are electrically separated from one another.

Then, the P-type semiconductor 150 and the active layer 140 are partially removed through a predetermined etching process to expose a portion of the N-type semiconductor layer 130. For example, an etching mask pattern for exposing a portion of the P-type semiconductor layer 150 is formed thereon, and exposed portions of the P-type semiconductor layer 150 and the active layer 140 are then removed through a dry or wet etching process so that the N-type semiconductor layer 130 can be partially exposed. At this time, an upper portion of the N-type semiconductor layer 130 may be partially removed simultaneously.

Thereafter, the first metal layer 160 is formed on the P-type semiconductor layer 150. The first metal layer 160 can be formed using a lift-off process. That is, a photoresist is applied on the entire structure, and a first photoresist pattern (not shown) for exposing the P-type semiconductor layer 150 is then formed through a lithographic and developing process using a predetermined mask. Subsequently, the first metal layer 160 is formed on the entire structure, and the first photoresist pattern is then removed. As a result, a portion of the metal layer 160 except another portion thereof located on the P-type semiconductor layer 150 is removed so that the first metal layer 160 remains on the P-type semiconductor layer 150.

The P-type metal bumper 170 is formed on the first metal layer 160, and the N-type metal bumper 180 is formed on the N-type semiconductor layer 130. To this end, a photoresist is applied on the entire structure, and a second photoresist pattern (not shown) for exposing a portion of the first metal layer 160 and a portion of the N-type semiconductor layer 130 is then formed through the lithographic and developing process using a predetermined mask. Then, a metal layer is deposited on the entire structure, and portions of the metal layer except a portion thereof formed on the exposed portion of the first metal layer 160 and a portion thereof formed on the exposed portion of the N-type semiconductor layer 130 and the second photoresist pattern are then removed. As a result, the P-type metal bumper 170 is formed on the first metal layer 160, and the N-type metal bumper 180 is formed on the N-type semiconductor layer 130.

The process of fabricating the light emitting cell block for a flip-chip type light emitting device according to the present invention is not limited to the aforementioned method but various modifications and material films may be further added thereto. That is, after the first metal layer is formed on the P-type semiconductor layer, the etching process of separating the light emitting cells may be performed. Further, after the N-type semiconductor layer is exposed, the exposed portion of the N-type semiconductor layer and a portion of the buffer layer below the portion of the N-type semiconductor layer may be removed to separate the light emitting cells. Moreover, a second metal layer formed of a metallic reflective film may be further formed on the first metal layer.

FIG. 5 is a sectional view illustrating a submount substrate 2000 for a flip-chip type light emitting device according to an embodiment of the present invention.

Referring to FIG. 5, the submount substrate 2000 comprises a substrate 200 having a plurality of N-regions B and P-regions A defined thereon, a dielectric film 210 formed on the substrate 200, and a plurality of electrode layers 230 each of which unitarily connects adjacent N-region B and P-region A to each other. The submount substrate further comprises a P-type bonding pad 240 extending to the P-region A located at an edge of the substrate, and an N-type bonding pad 250 extending to the N-region B located at the other edge thereof.

The N-regions B refer to regions to which the N-type metal bumpers 180 in the light emitting cell block 1000 are connected, and the P-regions A refer to regions to which the P-type metal bumpers 170 in the light emitting cell block 1000 are connected.

At this time, various materials with thermal conductivity can be used for the substrate 200 and, for example, SiC, Si, Ge, SiGe, AlN, metal and the like can be used. In a case where the substrate 200 is conductive, the dielectric film 210 electrically insulates the electrodes 230 and the bonding pads 240 and 250 from the substrate 200. The dielectric film 210 can be formed as a multi-layered film. The dielectric film 210 may be made of, for example, at least one of $SiO_2$, MgO and SiN.

The electrode layer 230, the N-type bonding pad 250 and the P-type bonding pad 240 are made of a metal with superior electrical conductivity.

A method of fabricating the submount substrate 2000 will be described below.

Concave portions and convex portions are formed on the substrate 200 to define the N-regions B and the P-regions A thereon. The widths, heights and shapes of the N-regions B and P-regions A may be modified variously depending on the sizes of the N-type metal bumpers 180 and the P-type metal bumpers 170. In this embodiment, the convex portions of the substrate 200 become the N-regions B, and the concave portions of the substrate 200 become the P-regions A. The substrate 200 with such a shape may be fabricated using a molding technique or through an etching process. That is, a mask for exposing the P-regions A is formed on the substrate 200, and exposed portions of the substrate 200 are then etched to form the recessed P-regions A. Then, the mask is removed so that the recessed P-regions A and the relatively protruding N-regions B are formed. Alternatively, the recessed P-regions A may be formed by means of machining.

Then, the dielectric film 210 is formed on the entire structure, i.e., the substrate 200 with the concave portions and the convex portions. At this time, the dielectric film 210 may not be formed in a case where the substrate 200 is not made of a conductive material. In this embodiment, a metallic material with superior electrical conductivity is used as the substrate 200 to improve thermal conductivity. Thus, the dielectric film 210 is formed to function as a sufficient insulator.

Next, the electrode layers 230 each of which connects adjacent N-region B and P-region A in pair are formed on the dielectric film 210. The electrode layers 230 may be formed through a screen printing method, or a vapor deposition process using a predetermined mask pattern.

Thereafter, the aforementioned light emitting cell block 1000 is bonded to the submount substrate 2000 so that a light emitting device is fabricated.

FIG. 6 is a sectional view illustrating a light emitting device having the light emitting cell block 1000 mounted on the submount substrate 2000.

Referring to FIG. 6, the P-type and N-type metal bumpers 170 and 180 of the light emitting cell block 1000 are bonded to the N-regions B and P-regions A of the submount substrate 2000, and the N-type metal bumper 180 and the P-type metal bumper 170 of two adjacent light emitting cells are connected to each other by the electrode layer 230 of the submount substrate 200, as shown in the figure. The P-type metal bumper 170 located at one edge of the light emitting cell block 1000 is connected to the P-type bonding pad 240 of the submount substrate 2000, and the N-type metal bumper 180 located at the other edge of the light emitting cell block 1000 is connected to the N-type bonding pad 250 of the submount substrate 2000.

At this time, the metal bumpers 170 and 180, the electrode layers 230, and the bonding pads 240 and 250 can be bonded through various bonding methods, e.g., an eutectic method using the eutectic temperature. As a result, the plurality of light emitting cells are bonded to the top of the submount substrate 2000, so that light emitting cell arrays connected in series are formed.

At this time, the number of the light emitting cells connected in series can be variously modified depending on an electric power source to be used and power consumption of the light emitting cells.

Preferably, a light emitting cell block 1000 with 10 to 1,000 light emitting cells formed thereon is bonded to the submount substrate 2000 to fabricate a light emitting device with the light emitting cells serially connected by the substrate 2000. More preferably, a light emitting cell block 1000 with 15 to 50 light emitting cells formed thereon is bonded to the submount substrate 2000 to fabricate a light emitting device with the light emitting cells serially connected by the substrate 2000. For example, when driven by a 220V AC power source, it is possible to fabricate a flip-chip type light emitting device with 66 or 67 unit light emitting cells of 3.3V at a certain driving current, which are bonded to the submount substrate 2000. Further, when driven by a 110V AC power source, it is possible to fabricate a light emitting device with 33 or 34 unit light emitting cells of 3.3V at a certain driving current, which are serially bonded to the submount substrate 2000.

The bonding method of the present invention is not limited thereto, and various embodiments can be made.

For example, instead of the light emitting cell block 1000 with the plurality of light emitting cells connected by the substrate 110 shown in FIG. 6, individual light emitting cells 100a, 100b and 100c may be located on the submount substrate 2000 while being spaced apart from one another as shown in FIG. 7. At this time, the N-type metal bumpers 170 and the P-type metal bumpers 180 of adjacent light emitting cells 100a to 100c are electrically connected to each other by the electrode layers 230 formed on the submount substrate 2000.

The light emitting cells 100a, 100b and 100c of FIG. 7 are fabricated by separating the substrate 110 from the plurality of light emitting cells in the light emitting cell block 1000 of FIG. 6. The substrate 110 can be separated from the light emitting cells using a laser or a grinding process.

Alternatively, as shown in FIG. 8, a light emitting device can be fabricated by forming electrode layers 230, which connect adjacent N-regions B and P-regions A in pairs, on a flat substrate 200 with the plurality of N-regions B and P-regions A defined thereon so as to form a submount substrate 2000, and by mounting a light emitting cell block on the submount substrate 2000. That is, the electrode layers 230 spaced apart from one another are formed on the substrate 200 on which certain patterns, e.g., concave portions and convex portions, are not formed, and the N-type metal bumpers 180 and the P-type metal bumpers 170 of adjacent light emitting cells are electrically connected to each other. At this time, the N-type metal bumpers 180 and the P-type metal bumpers 170 are bonded to the electrode layers 230 at the same level, as shown in the figure.

Meanwhile, instead of formation of the P-type and N-type metal bumpers 170 and 180 on the light emitting cells, the metal bumpers 170 and 180 may be formed on the N-regions B and P-regions A on the submount substrate 2000. At this time, certain metal electrodes (not shown) may be further formed on the N-type and P-type semiconductor layers 130 and 150 so as to be bonded to the metal bumpers 170 and 180.

In the embodiments of the present invention, the light emitting cells formed on the substrate 110 can be connected by the electrode layers 230 to form at least two serial light emitting cell arrays. The at least two serial light emitting cell arrays can be driven by a household AC power source while being connected in reverse parallel to each other. On the contrary, an additional bridge circuit may be configured within the light emitting device. The bridge circuit may be configured using the light emitting cells and the electrode layers.

In the aforementioned embodiments, the electrode layers of the submount substrate 2000 electrically connect the plurality of light emitting cells to one another to form the serial light emitting cell arrays. However, since the plurality of light emitting cells should be aligned with the electrode layers of the submount substrate 2000, it may be complicated to bond the plurality of light emitting cells to the submount substrate 2000 in the present embodiments.

A light emitting device capable of preventing the process of bonding a plurality of light emitting cells to a submount substrate or a lead frame from being complicated according to another embodiment of the present invention will be described below.

FIG. 9 is a sectional view illustrating a light emitting device 50 according to a still further embodiment of the present invention.

Referring to FIG. 9, the light emitting device 50 comprises a substrate 51 and a plurality of light emitting cells formed on the substrate. The substrate 51 is selected in consideration of a lattice coefficient of a semiconductor layer to be formed thereon. For example, in a case where a GaN based semiconductor layer is formed on the substrate 51, the substrate 51 may be a sapphire substrate.

Each of the light emitting cells comprises an N-type semiconductor layer 55, an active layer 57 and a P-type semiconductor layer 59. The active layer 57 is located on a portion of the N-type semiconductor 55, and the P-type semiconductor layer 59 is located on the active layer 57. Accordingly, a portion of a top surface of the N-type semiconductor layer is covered with the active layer 57 and the P-type semiconductor layer 59, and the remainder of the top surface of the N-type semiconductor layer is exposed. Meanwhile, a metal layer 61 may be located on the P-type semiconductor layer 59, and another metal layer 63 may be located on the other portion of the N-type semiconductor layer 55. The metal layers 61 and 63 form ohmic contacts with the P-type and N-type semiconductor layers to lower junction resistance. At this time, although the other metal layer 63 may be made of a material identical with a metallic material included in the metal layer, it is not limited thereto. Further, if there is no need for a metal layer for forming an additional ohmic contact, the metal layer 63 will be eliminated.

In the meantime, a buffer layer 53 may be interposed between the N-type semiconductor layer 55 and the substrate 51. The buffer layer 53 is used to reduce stress due to difference between lattice coefficients of the substrate 51 and the N-type semiconductor layer 55. As the buffer layer, a GaN based semiconductor layer can be used.

Although the N-type semiconductor layer 55 can be a GaN based film doped with N-type impurities, e.g., an N-type $Al_xGa_{1-x}N$ ($0 \leq x \leq 1$) film, it is not limited thereto, and may be formed of various semiconductor layers. Further, although the P-type semiconductor layer 59 can be a GaN based film doped with P-type impurities, e.g., a P-type $Al_xGa_{1-x}N$ ($0 \leq x \leq 1$) film, it is not limited thereto, and may be formed of various semiconductor layers. The N-type and P-type semiconductor layers may be $In_xGa_{1-x}N$ ($0 \leq x \leq 1$) films and formed into multi-layered films. Meanwhile, Si may be used as the N-type impurities, and Mg may be used as the P-type impurities. If the semiconductor layer is based on GaP rather than GaN, Zn may be used as the P-type impurities.

The active layer 57 generally has a multi-layered film structure in which quantum well layers and barrier layers are repeatedly formed. The quantum well layers and the barrier layers may be formed using an $Al_xIn_xGa_{1-x-y}N$ ($0 \leq x, y \leq 1$, $0 \leq x+y \leq 1$) compound and may be dope with N-type or P-type impurities.

In addition, the metal layer 61 may include first and second metal layers laminated one above another. The first metal layer and the second metal layer may be a transparent electrode layer and a reflective layer, respectively. The reflective layer improves optical efficiency by reflecting light, which has been emitted from the active layer and then transmitted through the transparent electrode layer, back to the substrate 51. The transparent electrode layer may be an indium-tin oxide (ITO) film, and the reflective layer may be a metal layer with reflectivity of 10 to 100%.

The light emitting cells can be fabricated by sequentially forming a buffer layer, an N-type semiconductor layer, an active layer and a P-type semiconductor layer on the substrate 51, and by etching them using a lithographic and etching process. At this time, the material layers can be formed through various deposition and growth methods such as metal organic chemical vapor deposition (MOCVD), molecular beam epitaxy (MBE), and hydride vapor phase epitaxy (HVPE). Before the lithographic and etching process is performed, a metal layer may be further formed on the P-type semiconductor layer.

After the light emitting cells are separated from one another using the lithographic and etching process, other metal layers 63 may be formed. The other metal layers may be formed by depositing metal layers on the separated light emitting cells and patterning the metal layers using the lithographic and etching process.

In the meantime, the N-type semiconductor layers and the P-type semiconductor layers of adjacent light emitting cells are electrically connected by respective connection electrodes 65. The light emitting cells are serially connected by the connection electrodes 65 to form a serial light emitting cell array. As described with reference to FIG. 2, at least two serial light emitting cell arrays may be formed on the substrate 51. The at least two serial light emitting cell arrays are arranged to be driven with currents flowing in opposite directions.

In the case where the metal layers 61 and 63 are formed on the N-type and P-type semiconductor layers 55 and 59, the connection electrodes 65 connect the metal layers 61 on the P-type semiconductor layers and the metal layers 63 on the N-type semiconductor layers. The connection electrodes 65 can connect the metal layers in the form of an air bridge or step-cover. The connection electrodes 65 can be formed using metal vapor deposition, electroplating or electroless plating.

In the meantime, metal bumpers 67a and 67b are located on both ends of the serial light emitting cell array. The metal bumpers 67a and 67b are metal bumpers performing a bumping function when the light emitting device 50 is mounted later on a submount substrate or a lead frame.

The thickness of the metal bumper 67a may be 0.01 to 100 μm, and top surfaces of the metal bumpers 67a and 67b are located at a level higher than that of the connection electrodes 65.

Meanwhile, metal bumpers may be formed at all both ends of the serial light emitting cell arrays but are not limited thereto. Metal bumpers may be formed at both ends of one serial array, and both ends of each of other serial arrays may be electrically connected to the metal bumpers.

The light emitting device 50 according to the embodiment of the present invention can be operated by being connected directly to an AC power source. Since the light emitting cells are connected to one another by the connection electrodes 65, the light emitting device 50 can be operated by bonding the metal bumpers 67a and 67b to a submount substrate or a lead frame. Therefore, even though there are the plurality of light emitting cells, it is possible to prevent the process of mounting the light emitting device 50 from being complicated.

FIG. 10 is a sectional view illustrating a light emitting device 70 according to a still further embodiment of the present invention.

Referring to FIG. 10, the light emitting device 70 comprises the same components as the light emitting device 50 described with reference to FIG. 9. Only parts of the light emitting device 70 different from those of the light emitting device 50 will be described below.

The light emitting device 70 of this embodiment has connection electrodes 75 located at the same level as the top surfaces of the metal bumpers 67a and 67b. Therefore, the metal bumpers 67a and 67b can be formed using a process identical with the process of forming the connection electrodes 75. Further, since the connection electrodes are also in contact with the top of a submount substrate or lead frame, the light emitting device 70 can improve heat dissipation as compared with the light emitting device 50 of FIG. 9.

FIGS. 11 to 13 are sectional views illustrating packages having the light emitting device 70 according to other embodiments of the present invention. FIG. 11 is a sectional view illustrating a package with the light emitting device 70 mounted on a lead frame, and FIGS. 12 and 13 are sectional views illustrating packages with the light emitting device 70 mounted on a submount substrate.

Referring to FIG. 11, a package 3000 comprises a lead frame with metal leads 101A and 101b. The lead frame can include a package body 103 in which the metal leads are insert-molded. Further, the lead frame may be a printed circuit board.

The light emitting device 70 is mounted on the lead frame and then electrically connected to the metal leads 101a and 101b. At this time, the metal bumpers 67a and 67b of the light emitting device 70 are bonded to the metal leads 101a and 101b, respectively. As a result, the serial light emitting cell arrays of the light emitting device 70 are electrically connected to the metal leads 101a and 101b. Meanwhile, the connection electrodes 75 are in physical contact with a top surface of the lead frame while being spaced apart from the metal leads. Therefore, heat generated from the light emitting device 70 can be easily dissipated to the lead frame through the connection electrodes 75.

A molding member 105 covers the top of the light emitting device 70. The molding member may contain a fluorescent substance and/or a diffusing substance. The fluorescent substance can convert a portion of light emitted from the light emitting device 70 into light with a longer wavelength. Thus, white light can be obtained using a light emitting device 70 emitting ultraviolet rays or blue light. Meanwhile, the fluorescent substance can be interposed between the molding member 105 and the light emitting device 70. The molding member 105 can have a lens shape to adjust a directional angle of emitted light.

In the meantime, the package 3000 can further include a heat sink 107 beneath the package body 103. The heat sink 107 promotes dissipation of heat emitted from the light emitting device 70.

According to this embodiment, there is provided a package 3000 that can be driven through direct connection to an AC power source by mounting the light emitting device 70 with the plurality of light emitting cells. Further, since the connection electrodes 75 are in physical contact with the top surface of the lead frame, the dissipation of the heat generated from the light emitting device 70 can be promoted.

Meanwhile, instead of the light emitting device 70, the light emitting device 50 of FIG. 9 may be mounted. At this time, since the connection electrodes 65 of the light emitting device 50 have a lower height as compared with the metal bumpers 67a and 67b, they do not come into physical contact with the top surface of the lead frame. Therefore, a short circuit between the connection electrodes 65 and the metal leads 101a and 101b can be easily prevented.

Referring to FIG. 12, a package 4000 according to this embodiment is configured by adding a submount substrate 201 and bonding wires 203a and 203b to the package 3000 described with reference to FIG. 11. The submount substrate 201 is interposed between the light emitting device 70 and a top surface of a lead frame.

The submount substrate 201 includes a substrate and bonding pads 201a and 201b formed on the substrate. The bonding pads correspond to the metal bumpers 67a and 67b of the light emitting device 70. The metal bumpers of the light emitting device are bonded to the bonding pads of the submount substrate.

It is preferred that the substrate of the submount substrate be made of a material with thermal conductivity. A substrate made of SiC, Si, germanium (Ge), silicone germanium (SiGe), aluminum nitride (AlN), metal or the like can be used as the substrate. Meanwhile, a dielectric layer may be formed on a top surface of the substrate. The dielectric layer insulates the bonding pads 201a and 201b and the connection electrodes 75 from the substrate. Meanwhile, if the substrate is made of an insulating material, the dielectric layer can be eliminated.

The bonding pads 201a and 201b, and the metal leads 101a and 101b are electrically connected through bonding wires.

As described with reference to FIG. 11, instead of the light emitting device 70, the light emitting device 50 of FIG. 9 may be mounted.

Referring to FIG. 13, a package 5000 according to this embodiment has a submount substrate 301 interposed between the light emitting device 70 and the lead frame, in the same manner as the package illustrated in FIG. 12. However, the submount substrate 301 is different from the submount substrate 201 of FIG. 12 in that it has bonding pads 301a and 301b penetrating through the submount substrate. Accordingly, since the bonding pads are bonded directly to the metal leads 101a and 101b, the bonding wires of FIG. 12 can be eliminated.

The submount substrate 301 is not limited thereto but may be variously modified. For example, the bonding pads 301a and 301b may not penetrate through the submount substrate but extend to the bottom of the submount substrate along the sides of the substrate, respectively.

Further, instead of the light emitting device 70, the light emitting device 50 of FIG. 9 may be mounted on the submount substrate 301.

The invention claimed is:

1. A light emitting device, comprising:
a plurality of light emitting cells arranged on a substrate, each of the light emitting cells comprising:
  a buffer layer arranged directly on the substrate;
  an N-type semiconductor layer arranged on the buffer layer;
  an active layer arranged on a portion of the N-type semiconductor layer; and
  a P-type semiconductor layer arranged on the active layer;
an N-type metal bumper arranged on the N-type semiconductor layer of a first light emitting cell among the plurality of light emitting cells;
a P-type metal bumper arranged on the P-type semiconductor layer of a second light emitting cell among the plurality of light emitting cells; and
a plurality of connection electrodes for electrically connecting the N-type semiconductor layers and the P-type semiconductor layers of adjacent light emitting cells to form a serial light emitting cell array on the substrate, and the first light emitting cell and the second light emitting cell are respectively arranged at a first end and a second end of the serial light emitting cell array,
wherein the top surface of the N-type metal bumper and the top surface of the P-type metal bumper are higher above the substrate than top surfaces of the connection electrodes.

2. The light emitting device of claim 1, further comprising:
N-type metal bumpers arranged on N-type semiconductor layers of light emitting cells except the first light emitting cell among the plurality of light emitting cells; and
P-type metal bumpers arranged on P-type semiconductor layers of light emitting cells except for the second light emitting cell among the plurality of light emitting cells.

3. The light emitting device of claim 1, wherein each of the plurality of the light emitting cells further comprises:
a first metal layer arranged on the P-type semiconductor layer; and
a second metal layer arranged on the first metal layer.

4. The light emitting device of claim 3, wherein the first metal layer and the second metal layer comprise a transparent electrode and a reflective film, respectively.

5. A light emitting diode package, comprising:
a lead frame comprising metal leads;
a light emitting device mounted on the lead frame, the light emitting device comprising:
a plurality of light emitting cells arranged on a substrate, each of the light emitting cells comprising:
  a buffer layer arranged directly on the substrate;
  an N-type semiconductor layer arranged on the buffer layer;
  an active layer arranged on a portion of the N-type semiconductor layer; and
  a P-type semiconductor layer arranged on the active layer;
a plurality of connection electrodes connecting N-type semiconductor layers and P-type semiconductor layers of adjacent light emitting cells to form a serial light emitting cell array on the substrate;
metal bumpers arranged at a first end and a second end of the serial light emitting cell array, the metal bumpers being connected to the metal leads; and
a submount substrate interposed between the lead frame and the light emitting device,
wherein the submount substrate comprises bonding pads corresponding to the metal bumpers on a top surface thereof, the bonding pads are electrically connected to the metal leads, and
wherein the connection electrodes contact the top surface of the submount substrate and are spaced apart from the bonding pads.

6. The package of claim 5, wherein bonding wires connect the bonding pads to the metal leads.

7. The package of claim 5, wherein the plurality of light emitting cells is connected such that the light emitting device can be directly driven using an alternating current (AC) power source.

8. The light emitting package of claim 7, wherein the first metal layer comprises a transparent electrode and the second metal layer comprises a reflective film.

9. A light emitting diode package, comprising:
a lead frame comprising a first metal lead and a second metal lead; and
a light emitting device mounted on the lead frame, the light emitting device comprising a first light emitting cell, a second light emitting cell, and a third light emitting cell arranged on a substrate and connected to each other in series by connection electrodes,
wherein the first light emitting cell comprises an N-type semiconductor layer arranged on the substrate, an active layer arranged on a portion of the N-type semiconductor layer, a P-type semiconductor layer arranged on the active layer, a first metal layer arranged on the P-type semiconductor layer, and a first metal bumper arranged on the first metal layer;
wherein the second light emitting cell comprises an N-type semiconductor layer arranged on the substrate, an active layer arranged on a portion of the N-type semiconductor layer, a P-type semiconductor layer arranged on the active layer, and a second metal bumper arranged on the N-type semiconductor layer; and
wherein the first metal bumper is electrically connected to the first metal lead, and the second metal bumper is electrically connected to the second metal lead; and
a submount substrate arranged between the lead frame and the light emitting device,
wherein the submount substrate comprises a first bonding pad and a second bonding pad, wherein the first metal bumper is electrically connected to the first bonding pad, and the second metal bumper is electrically connected to the second bonding pad,
wherein a first connection electrode is arranged on the N-type semiconductor layer of the first light emitting cell and on a first metal layer of the third light emitting cell immediately adjacent to the first light emitting cell,
wherein a second connection electrode is arranged on an N-type semiconductor layer of the third light emitting cell immediately adjacent to the second light emitting cell and on the P-type semiconductor layer of the second light emitting cell, and
wherein top surfaces of the first metal bumper and the second metal bumper are higher above the substrate than top surfaces of the first connection electrode and the second connection electrode.

10. The package of claim 9, wherein the first light emitting cell further comprises a second metal layer arranged between the first metal layer and the first metal bumper, the first metal layer comprises a transparent material, and the second metal layer comprises a reflective material.

11. The package of claim 9, wherein the second light emitting cell further comprises a third metal layer, the third metal layer being arranged between the N-type semiconductor layer and the second metal bumper.

12. The package of claim 9, wherein the first metal bumper is arranged directly on the first metal lead, and the second metal bumper is arranged directly on the second metal lead.

13. The package of claim 9, further comprising a first bonding wire that electrically connects the first bonding pad with the first metal lead and a second bonding wire that electrically connects the second bonding pad with the second metal lead.

14. The package of claim 9, wherein the first metal bumper is arranged directly on the first bonding pad, and the first bonding pad is arranged directly on the first metal lead; and wherein the second metal bumper is arranged directly on the second bonding pad, and the second bonding pad is arranged directly on the second metal lead.

15. The package of claim 9, wherein a plurality of third light emitting cells is arranged between the first light emitting cell and the second light emitting cell, and the first light emitting cell, the second light emitting cell, and the plurality of third light emitting cells is connected to each other in series by connection electrodes 16. The package of claim 9, wherein top surfaces of the first metal bumper and the second metal bumper are disposed directly on a top surface of the submount substrate, and top surfaces of the first connection electrode and the second connection electrode are spaced apart from the top surface of the submount substrate, and wherein the top surfaces of the first connection electrode and the second connection electrode are spaced apart from the first bonding pad and the second bonding pad.

\* \* \* \* \*